(12) United States Patent
Morita et al.

(10) Patent No.: US 8,338,527 B2
(45) Date of Patent: Dec. 25, 2012

(54) CURABLE SILICONE COMPOSITION AND ELECTRONIC COMPONENTS

(75) Inventors: Yoshitsugu Morita, Ichihara (JP); Minoru Isshiki, Otsu (JP); Tomoko Kato, Ichihara (JP)

(73) Assignee: Dow Corning Toray Company, Ltd., Chiyoda-ku, Tokyo (JP)

( * ) Notice: Subject to any disclaimer, the term of this patent is extended or adjusted under 35 U.S.C. 154(b) by 456 days.

(21) Appl. No.: 11/912,643

(22) PCT Filed: Apr. 27, 2006

(86) PCT No.: PCT/JP2006/309219
§ 371 (c)(1), (2), (4) Date: Feb. 6, 2009

(87) PCT Pub. No.: WO2006/118335
PCT Pub. Date: Nov. 9, 2006

(65) Prior Publication Data
US 2009/0203837 A1 Aug. 13, 2009

(30) Foreign Application Priority Data
Apr. 27, 2005 (JP) .................. 2005-129442

(51) Int. Cl.
C08L 83/06 (2006.01)
C08G 77/14 (2006.01)
(52) U.S. Cl. ........................ 524/588; 525/477
(58) Field of Classification Search .......... 524/588
See application file for complete search history.

(56) References Cited

U.S. PATENT DOCUMENTS

| | | |
|---|---|---|
| 3,168,405 A | 2/1965 | Martin et al. |
| 3,410,820 A | 11/1968 | Harrod |
| 5,021,494 A | 6/1991 | Toya |
| 5,143,951 A | 9/1992 | Ohta et al. |
| 5,206,312 A | 4/1993 | Liao et al. |
| 5,283,309 A * | 2/1994 | Morita ............ 528/27 |
| 5,290,883 A | 3/1994 | Hosokawa et al. |
| 5,319,005 A | 6/1994 | Hagiwara et al. |
| 5,344,905 A | 9/1994 | Morita |

(Continued)

FOREIGN PATENT DOCUMENTS

EP 282977 A2 * 9/1988

(Continued)

OTHER PUBLICATIONS

U.S. Appl. No. 12/520,900, filed Jun. 2009, Morita et al.*

(Continued)

*Primary Examiner* — Robert S Loewe
(74) *Attorney, Agent, or Firm* — Howard & Howard Attorneys PLLC

(57) ABSTRACT

A curable silicone composition comprising: (A) an organopolysiloxane that is represented by a specific average unit formula and that has at least two of the aforementioned epoxy-functional monovalent organic groups in each molecule; (B) a diorganosiloxane represented by the general formula: $A-R^5-(R^4_2SiO)_m R^4_2Si-R^5-A$, wherein $R^4$ is substituted or unsubstituted mono-valent hydrocarbon group that does not contain an aliphatically unsaturated bond, $R^5$ is a divalent organic group, A is a siloxane residue with a specific average unit formula, and m is an integer with a value of at least 1; and (C) a curing agent for epoxy resin, exhibits excellent handling and curing characteristics and that cures to give a cured product that exhibits excellent flexibility and adhesiveness.

10 Claims, 1 Drawing Sheet

U.S. PATENT DOCUMENTS

| | | | |
|---|---|---|---|
| 5,358,983 | A | 10/1994 | Morita |
| 5,512,640 | A | 4/1996 | Osawa et al. |
| 5,516,858 | A | 5/1996 | Morita et al. |
| 5,530,075 | A | 6/1996 | Morita et al. |
| 5,575,956 | A | 11/1996 | Hermansen et al. |
| 5,618,631 | A | 4/1997 | Meguriya et al. |
| 5,623,026 | A | 4/1997 | Buekers et al. |
| 5,645,941 | A | 7/1997 | Meguriya et al. |
| 5,714,265 | A | 2/1998 | Meguriya et al. |
| 5,859,127 | A | 1/1999 | Nakano et al. |
| 5,952,439 | A | 9/1999 | Morita et al. |
| 5,998,509 | A * | 12/1999 | Hayase et al. ............... 523/425 |
| 6,117,953 | A | 9/2000 | Ichiroku et al. |
| 6,235,862 | B1 | 5/2001 | Isshiki et al. |
| 6,248,454 | B1 | 6/2001 | Ikemura |
| 6,512,031 | B1 | 1/2003 | Honda et al. |
| 7,138,467 | B2 | 11/2006 | Furukawa et al. |
| 2002/0015748 | A1 | 2/2002 | Miyajima et al. |
| 2002/0028335 | A1 | 3/2002 | Fujiki et al. |
| 2003/0010962 | A1 | 1/2003 | Kuwabara et al. |
| 2003/0071366 | A1 | 4/2003 | Rubinsztajn et al. |
| 2003/0207123 | A1 | 11/2003 | Brunelle et al. |
| 2003/0212230 | A1 | 11/2003 | Rubinsztajn et al. |
| 2004/0198925 | A1 | 10/2004 | Morita et al. |
| 2004/0242762 | A1 | 12/2004 | Horikoshi et al. |
| 2005/0037537 | A1 | 2/2005 | Kim et al. |
| 2005/0080204 | A1* | 4/2005 | Furukawa et al. ............ 525/477 |
| 2005/0129957 | A1 | 6/2005 | Kashiwagi et al. |
| 2005/0159577 | A1 | 7/2005 | Davis et al. |
| 2005/0222298 | A1 | 10/2005 | Rubinsztajn et al. |
| 2005/0267286 | A1 | 12/2005 | Nakamura et al. |
| 2006/0038304 | A1 | 2/2006 | Osako et al. |
| 2007/0149727 | A1 | 6/2007 | Okuhira et al. |
| 2009/0203837 | A1 | 8/2009 | Morita et al. |
| 2010/0063185 | A1* | 3/2010 | Morita et al. ............... 524/109 |

FOREIGN PATENT DOCUMENTS

| | | | |
|---|---|---|---|
| EP | 0282977 | A2 | 9/1988 |
| EP | 0464706 | A1 | 1/1992 |
| EP | 0543384 | A1 | 5/1993 |
| EP | 0567079 | A1 | 10/1993 |
| EP | 0571965 | A1 | 12/1993 |
| EP | 0620242 | A2 | 10/1994 |
| EP | 0647682 | A1 | 4/1995 |
| EP | 0821038 | A2 | 1/1998 |
| EP | 1002834 | A1 | 5/2000 |
| EP | 1162239 | A2 | 12/2001 |
| EP | 1319690 | A2 | 6/2003 |
| GB | 2 279 616 | A | 1/1995 |
| JP | 05105758 | A | 4/1993 |
| JP | 5295084 | | 11/1993 |
| JP | 05295084 | A | 11/1993 |
| JP | 05320514 | A | 12/1993 |
| JP | 06056999 | A * | 3/1994 |
| JP | 06-306084 | | 11/1994 |
| JP | 06306084 | A | 11/1994 |
| JP | 07-022441 | | 1/1995 |
| JP | 07022441 | A | 1/1995 |
| JP | 07053870 | A | 2/1995 |
| JP | 07-118365 | | 5/1995 |
| JP | 07118365 | A | 5/1995 |
| JP | 07-161740 | | 6/1995 |
| JP | 08-176447 | | 7/1996 |
| JP | 08244064 | A | 9/1996 |
| JP | 09-095651 | | 4/1997 |
| JP | 10-130465 | | 5/1998 |
| JP | 10130465 | A | 5/1998 |
| JP | 10-147764 | | 6/1998 |
| JP | 10-163232 | | 6/1998 |
| JP | 10147764 | A | 6/1998 |
| JP | 10163232 | A | 6/1998 |
| JP | 11012546 | | 1/1999 |
| JP | 11077733 | A | 3/1999 |
| JP | 2000277551 | A | 10/2000 |
| JP | 2002220486 | A * | 8/2002 |
| JP | 2004-043814 | | 2/2004 |
| JP | 2004-043815 | | 2/2004 |
| JP | 2004296555 | A | 10/2004 |
| JP | 2005154766 | A | 6/2005 |
| JP | 2005183788 | A | 7/2005 |
| JP | 2005268565 | A | 9/2005 |
| JP | 2006306953 | A | 11/2006 |
| JP | 2006306954 | A | 11/2006 |
| WO | WO 02/097393 | A3 | 12/2002 |
| WO | 03072656 | A1 | 9/2003 |
| WO | WO 2005/021652 | A1 | 3/2005 |
| WO | 2005044920 | A1 | 5/2005 |
| WO | WO 2005/044920 | A1 | 5/2005 |
| WO | 2005062368 | A1 | 7/2005 |
| WO | 2006011676 | A1 | 2/2006 |
| WO | 2006118334 | A1 | 11/2006 |
| WO | 2006118335 | A1 | 11/2006 |

OTHER PUBLICATIONS

U.S. Appl. No. 12/440,824, filed Mar. 2009, Morita et al.*
U.S. Appl. No. 12/280,248, filed Aug. 2008, Morita et al.*
English language abstract for JP5295084 extracted from esp@cenet.com, Jan. 11, 2007.
English language translation and abstract for JP06-306084 extracted from Searching PAJ, Jan. 1, 2008, pp. 28.
English language translation and abstract for JP07-022441 extracted from Searching PAJ, Jan. 1, 2008, pp. 15.
English language translation and abstract for JP07-118365 extracted from Searching PAJ, Jan. 1, 2008, pp. 16.
English language translation and abstract for JP07-161740 extracted from Searching PAJ, Jan. 1, 2008, pp. 15.
English language translation and abstract for JP08-176447 extracted from Searching PAJ, Dec. 9, 2007, pp. 28.
English language translation and abstract for JP09-095651 extracted from Searching PAJ, Jan. 1, 2008, pp. 15.
English language translation and abstract for JP10-130465 extracted from Searching PAJ, Jan. 1, 2008, pp. 12.
English language translation and abstract for JP10-147764 extracted from Searching PAJ, Jan. 1, 2008, pp. 14.
English language translation and abstract for JP10-163232 extracted from Searching PAJ, Jan. 1, 2008, pp. 16.
English language abstract for JP11-012546 extracted from esp@cenet.com, Dec. 16, 2007.
English language translation and abstract for JP2004-043814 extracted from Searching PAJ, Dec. 16, 2007, pp. 51.
English language translation and abstract for JP2004-043815 extracted from Searching PAJ, Dec. 9, 2007, pp. 21.
PCT International Search Report for PCT/JP2005/018405, Mar. 6, 2006, 6 pages.
PCT International Search Report for PCT/JP2005/024196, Mar. 8, 2006, 3 pages.
PCT International Search Report for PCT/JP2006/303996, Jul. 7, 2006, 3 pages.
PCT International Search Report for PCT/JP2006/039218, Jul. 14, 2006, 4 pages.
PCT International Search Report for PCT/JP2005/011864, Nov. 10, 2005, 5 pages.
Yongxin Han et al. "Silicon Directed ipso—Substitution of Polymer Bound Arylsilanes: Preparation of Biaryls via", Tetrahedron Letters, vol. 37, No. 16. 1996, pp. 2703-2706.
Schultz et al., "The Synthesis of Trimethylsilylmethoxymethyl Chloride", OPPI Briefs, vol. 27, No. 5, 1995, pp. 572-574.
Hojo et al., "New Access to Carbonyl Ylides by the Silicon-Based 1,3-Elimination and Their:..", Tetrahedron Letters, vol. 34, No. 37, 1993, pp. 5943-5946.
Boons et al., "Use of (Phenyldimethylsilyl)methoxymethyl and (Phenyldimethylsilyl) methyl ethers . . . ", Tetrahedron Letters, vol. 31, No. 15, 1990, pp. 2197-2200.
Hasseberg et al., "104. Synthese von Orellin", Helvetica Chimica Acta—vol. 71, No. 5, 1988, pp. 957-963.
Guedin-Vuong et al., "An Easy Access to Homopropargylic Ethers", Bulletin De La Societe Chimique De France, No. 2, 1986, pp. 245-252.

Pyne et al., "Chiral and Stereochemical Control via Intramolecular Diels-Alder Reaction of Z Dienes", J. American Chemical Society, vol. 104, No. 21, 1982, pp. 5719-5728.
Lipshutz et al., "B-(Trimethylylsilyl) Ethoxymethyl Chloride . . . ," Tetrahedron Letters, vol. 21, No. 35, 1980, pp. 3343-3346.
Shikhiev et al., "Synthesis and Reactions of Unsaturated Organosilicon Compounds", J. Of General Chemistry of the USSR, vol. 41, No. 3, 1971, pp. 617-619.
Shipov et al., "Synthesis of Alkyl Chloromethyl Ethers", J. Of General Chemistry of the USSR, vol. 59, No. 5.2, 1989, p. 1067.
Miramon et al., "Short Synthesis of Polyoxygenated Macrocyclic . . . ", Journal of Organic Chemistry, vol. 69, No. 20, 2004, pp. 6949-6952.
Shikhiev et al., "Synthesis and Reactions of Some Heteroorganic Ethers . . . ", J. Of General Chemistry of the USSR, vol. 45, No. 1, 1975, pp. 91-93.
PCT International Search Report for PCTJP2007074607, dated Dec. 14, 2007, 3 pages.
English language translation and abstract for JP 06056999 Extracted from PAJ database, dated Jul. 6, 2009, 71 pages.
English language translation and abstract for JP 08244064 Extracted from PAJ database, dated May 29, 2008, 41 pages.
English language translation and abstract for JP 11077733 extracted from PAJ database, dated May 29, 2008, 35 pages.
English language abstract for JP 2000277551 extracted from espacement.com database, dated Feb. 2, 2009, 11 pages.
English language translation and abstract for JP 2004296555 Extracted from PAJ database, dated Feb. 2, 2009, 60 pages.
English language translation and abstract for JP 2005183788 Extracted from PAJ database, dated Feb. 2, 2009, 69 pages.
English language translation and abstract for JP 2005268565 Extracted from PAJ database, dated Feb. 2, 2009, 51 pages.
English language translation and abstract for JP 05295084 extracted from PAJ database dated Jul. 6, 2009, 56 pages.
English language translation and abstract for JP 05320514 extracted from PAJ database dated Jul. 6, 2009, 44 pages.
English language translation and abstract for JP 06306084 extracted from PAJ database dated Jul. 21, 2009, 61 pages.
English language translation and abstract for JP 07053870 extracted from PAJ database dated Jul. 6, 2009, 51 pages.
English language translation and abstract for JP 07118365 extracted from PAJ database dated Jul. 21, 2009, 23 pages.
English language translation and abstract for JP 07022441 extracted from PAJ database dated Jul. 21, 2009, 21 pages.
English language translation and abstract for JP 10130465 extracted from PAJ database dated Jul. 21, 2009, 25 pages.
English language translation and abstract for JP 10147764 extracted from PAJ database dated Jul. 21, 2009, 23 pages.
English language translation and abstract for JP 10163232 extracted from PAJ database dated Jul. 21, 2009, 24 pages.
English language translation and abstract for JP 05105758 extracted from PAJ database, dated Nov. 10, 2009, 43 pages.
English language translation and abstract for JP 2005154766 extracted from PAJ database, dated Nov. 6, 2009, 55 pages.
English language translation and abstract for JP 2006306953 extracted from PAJ database, dated Nov. 6, 2009, 55 pages.
English language translation and abstract for JP 2006306954 extracted from PAJ database, dated Nov. 6, 2009, 78 pages.
PCT International Search Report for PCT/JP2007/074606, dated Mar. 25, 2008, 3 pages.
PCT International Search Report for PCT/JP2007/053131, dated May 29, 2007, 4 pages.
PCT International Search Report for PCT/JP2004/016716, dated Feb. 17, 2005, 2 pages.
PCT International Search Report for PCT/JP2007/066829, dated Dec. 6, 2007, 3 pages.

* cited by examiner

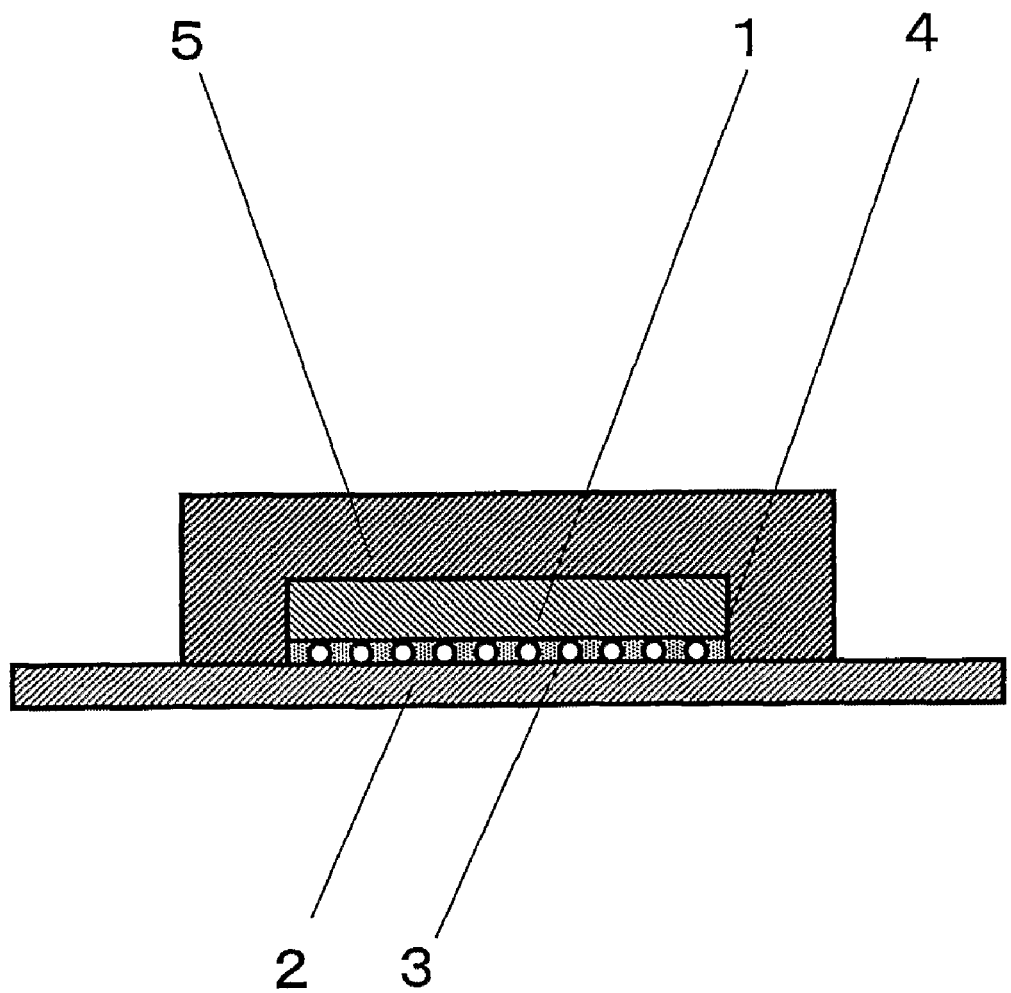

CURABLE SILICONE COMPOSITION AND ELECTRONIC COMPONENTS

RELATED APPLICATIONS

This application claims priority to and all the advantages of International Patent Application No. PCT/JP2006/309219, filed on Apr. 27, 2006, which claims priority to Japanese Patent Application No. JP2005-129442, filed on Apr. 27, 2005.

TECHNICAL FIELD

The present invention relates to a curable silicone composition and to electronic components. The present invention more particularly relates to a curable silicone composition that exhibits excellent handling and curing characteristics and that cures to give a cured product that is very flexible and highly adhesive. The present invention also more particularly relates to highly reliable electronic components that have been sealed or bonded by cured product from the aforesaid composition.

BACKGROUND ART

The curable resin compositions heretofore used as sealants and adhesives for electrical/electronic components, for example, curable epoxy resin compositions, have yielded stiff, high-modulus cured products, resulting in a propensity for large stresses to be produced in the electrical/electronic component due to thermal expansion of the cured product; additional problems are warping of the electrical/electronic component or substrate, the appearance of cracks in the cured product itself, the generation of gaps between the electrical/electronic component and the cured product, and failure of the electrical/electronic component.

In order to reduce the stress associated with the cured product, a curable resin composition containing epoxy-functional silicone resin (refer to Japanese Laid-Open (Unexamined) Patent Application Number Hei 5-295084 (295,084/1993)), die-attach pastes comprising epoxy resin and the reaction product of cyanate resin with an epoxy-functional dimethylsiloxane compound (refer to Japanese Laid-Open (Unexamined) Patent Application Numbers Hei 10-147764 (147,764/1998) and Hei 10-163232 (163,232/1998)), and die-bonding materials comprising the reaction product of epoxy-functional silicone oil and a phenolic organic compound (refer to Japanese Laid Open (Unexamined) Patent Application Numbers Hei 7-22441 (22,441/1995), Hei 7-118365 (118,365/1995), and Hei 10-130465 (130,465/1998)) have been introduced. However, the cured products therefrom are still stiff and the stress-reducing effect is inadequate and there are limitations with regard to applications to electrical/electronic components.

In another vein, curable silicone compositions provide cured products that have excellent electrical characteristics, e.g., dielectric characteristics, volumetric resistivity, and dielectric breakdown strength, and for this reason are used as sealants and adhesives for electrical/electronic components. However, they yield cured products that are, conversely, soft and that have a low strength and a low modulus, and this has resulted in a poor capacity to protect electrical/electronic components, that is, a poor performance with regard to protecting electrical/electronic components from external impact or shock. In addition, these cured products, because they exhibit low adhesiveness for electrical/electronic components, have been associated with the facile generation of gaps between the cured product and these components. While there have been attempts at lowering the thermal expansion coefficient of the soft cured product by incorporating filler, this results in a loss of the softness and flexibility.

Japanese Laid Open (Unexamined) Patent Application Number Hei 6-306084 (306,084/1994) discloses a curable silicone composition that has a short gelation time; this curable silicone composition comprises epoxy-modified silicone oil and phenol-modified silicone oil. This curable silicone composition, however, exhibits a poor curability and requires a lengthy period of heating for cure. In addition, it generates a very brittle cured material.

It is an object of the present invention to provide a curable silicone composition that exhibits excellent handling and curing characteristics and that cures to give a cured product that is very flexible and highly adhesive. It is a further object of the present invention to provide highly reliable electronic components.

DISCLOSURE OF INVENTION

The curable silicone composition of the present invention comprises:

(A) an organopolysiloxane that is represented by the average unit formula:

$$(R^1{}_3SiO_{1/2})_a(R^2{}_2SiO_{2/2})_b(R^3SiO_{3/2})_c$$

(wherein $R^1$, $R^2$, and $R^3$ are each independently selected from substituted or unsubstituted monovalent hydrocarbon groups and epoxy-functional monovalent organic groups, with the proviso that at least 20 mole % of $R^3$ are aryl groups, and a, b, and c are numbers that satisfy $0 \leq a \leq 0.8$, $0 \leq b \leq 0.8$, $0.2 \leq c \leq 0.9$, and $a+b+c=1$), and that has at least two of the aforementioned epoxy-functional monovalent organic groups in each molecule;

(B) a diorganosiloxane represented by the general formula:

$$A-R^5-(R^4{}_2SiO)_m R^4{}_2Si-R^5-A$$

(wherein $R^4$ is substituted or unsubstituted hydrocarbon group that does not contain an aliphatically unsaturated bond, $R^5$ is a divalent organic group, A is a siloxane residue with the average unit formula:

$$(XR^4{}_2SiO_{1/2})_d(SiO_{4/2})_e$$

(wherein $R^4$ is defined as above; X is a single bond, hydrogen atom, group defined as for the aforementioned $R^4$, epoxy-functional monovalent organic group, or alkoxysilylalkyl group, with the proviso that at least one X in each molecule is a single bond and at least two X's in each molecule are epoxy-functional monovalent organic groups; d is a positive number; e is a positive number; and d/e is a positive number from 0.2 to 4), and m is an integer with a value of at least 1); and (C) a curing agent for epoxy resin.

The electronic component of the present invention is characteristically sealed or bonded by cured product from the above-described curable silicone composition.

Effects of Invention

The curable silicone composition of the present invention, because it exhibits excellent handling and curing characteristics, enables a shortening of the heating time or a lowering of the thermosetting temperature during its molding operations. This, as a consequence, enables a lowering of the internal stresses due to thermal expansion and can prevent damage to small, fragile components when the curable silicone composition is used as a protective agent, sealant, or adhesive for such components and can also provide a tight adhesion with substrate. Electronic components of the present invention, because they are sealed or bonded by cured product from the curable silicone composition, are characterized by an excellent reliability.

BRIEF DESCRIPTION OF THE DRAWINGS

FIG. 1 is a cross-sectional diagram of an LSI that is an example of an electronic component of the present invention.

REFERENCE NUMBERS 1 semiconductor element
2 substrate
3 ball grid
4 underfill material
5 cured product from a curable silicone composition

DETAILED DESCRIPTION OF THE INVENTION

The curable silicone composition of the present invention will be described in detail first.

Component (A), which is a main component of the subject composition, is organopolysiloxane represented by the average unit formula:

$(R^1_3SiO_{1/2})_a(R^2_2SiO_{2/2})_b(R^3SiO_{3/2})_c.$ $R^1$, $R^2$, and $R^3$ in this formula are each independently selected from substituted or unsubstituted monovalent hydrocarbon groups and epoxy-functional monovalent organic groups. The subject monovalent hydrocarbon groups can be exemplified by alkyl groups such as methyl, ethyl, propyl, butyl, pentyl, and so forth; alkenyl groups such as vinyl, allyl, butenyl, pentenyl, hexenyl, and so forth; aryl groups such as phenyl, tolyl, xylyl, and so forth; aralkyl groups such as benzyl, phenethyl, and so forth; and halogenated alkyl groups such as chloromethyl, 3,3,3-trifluoropropyl, and so forth. Alkyl groups and aryl groups are preferred, and methyl and phenyl are particularly preferred. The epoxy-functional monovalent organic groups can be exemplified by glycidoxyalkyl groups such as 2-glycidoxyethyl, 3-glycidoxypropyl, 4-glycidoxybutyl, and so forth; epoxycycloalkylalkyl groups such as 2-(3,4-epoxycyclohexyl)ethyl, 3-(3,4-epoxycyclohexyl)propyl, 2-(3,4-epoxy-3-methylcyclohexyl)-2-methylethyl, and so forth; and oxiranylalkyl groups such as 4-oxiranylbutyl, 8-oxiranyloctyl, and so forth. Glycidoxyalkyl groups and epoxycycloalkylalkyl groups are preferred, and 3-glycidoxypropyl and 2-(3,4-epoxycyclohexyl)ethyl are particularly preferred.

At least 20 mol % of the $R^3$ in the preceding formula must be aryl groups, and preferably at least 50 mol % and particularly preferably at least 80 mol % are aryl groups. Problems such as a decline in the compatibility with component (B), a decline in the adhesiveness of the resulting composition, and a decline in the mechanical strength of the ultimately obtained cured product occur when the proportion of aryl groups in $R^3$ is below the lower limit for the given range. Phenyl is particularly preferred for the aryl groups encompassed by $R^3$.

a, b, and c in the preceding formula are numbers that satisfy the following: $0 \leq a \leq 0.8$, $0 \leq b \leq 0.8$, $0.2 \leq c \leq 0.9$, and $a+b+c=1$. a is a number that represents the proportion of the $R^1_3SiO_{1/2}$ siloxane unit. When component (A) is composed of only the $R^3SiO_{3/2}$ siloxane unit, its viscosity becomes elevated and the handling characteristics of the resulting composition deteriorate, and for this reason a is a number preferably satisfying $0 \leq a \leq 0.8$ and more preferably $0.3 \leq a \leq 0.8$. b is a number that represents the proportion of the $R^2_2SiO_{2/2}$ siloxane unit and preferably is a number satisfying $0 \leq b \leq 0.6$ because this impedes outmigration of component (A) from the resulting cured product at suitable molecular weights and also yields cured product with an excellent mechanical strength. c is a number that represents the proportion of the $R^3SiO_{3/2}$ siloxane unit and is preferably a number satisfying $0.4 \leq c \leq 0.9$ because this provides the instant composition with good handling characteristics and a good adhesiveness and provides the cured product therefrom with a good mechanical strength and a good flexibility.

Component (A) must have at least two of the aforementioned epoxy-functional monovalent organic groups in each molecule. While the content of epoxy-functional monovalent organic group in component (A) is not otherwise specifically limited, the epoxy equivalent weight of component (A) (the value afforded by dividing the mass-average molecular weight of component (A) by the number of epoxy groups in the molecule) is preferably in the range from 100 to 2,000, is more preferably in the range from 100 to 1,000, and particularly preferably is in the range from 100 to 700. The flexibility of the cured product declines when the epoxy equivalent weight is below the lower limit on the aforementioned range, while exceeding the upper limit on this range results in problems such as a decline in the adhesiveness and curability of the resulting composition and a decline in the mechanical strength of the cured product. Component (A) may be a single organopolysiloxane or a mixture of two or more organopolysiloxanes. The state of component (A) at 25° C. is not critical, and it can be, for example, a liquid or solid. Solid component (A) can be mixed to homogeneity with the other components through the use of an organic solvent or by heating. Component (A) is preferably a liquid at 25° C. because this provides a good blendability with the other components and provides good handling characteristics. The mass-average molecular weight of component (A) is not critical, but is preferably in the range of 500 to 10,000 and particularly preferably is in the range of 750 to 3,000.

The following organopolysiloxanes are examples of component (A). a, b, and c in these formulas are defined as above, except that a and b in the following formulas are not zero. c' and c" in these formulas are numbers that satisfy the following conditions: $0.1 \leq c' \leq 0.8$, $0" c" < 0.2$, $0.2 \leq c'+C" \leq 0.9$, and $0.2 \leq c'/(c'+c")$. G in the following formulas represents 3-glycidoxypropyl and E represents 2-(3,4-epoxycyclohexyl)ethyl.

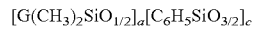
$[G(CH_3)_2SiO_{1/2}]_a[C_6H_5SiO_{3/2}]_c$

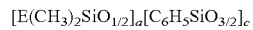
$[E(CH_3)_2SiO_{1/2}]_a[C_6H_5SiO_{3/2}]_c$

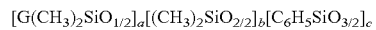
$[G(CH_3)_2SiO_{1/2}]_a[(CH_3)_2SiO_{2/2}]_b[C_6H_5SiO_{3/2}]_c$

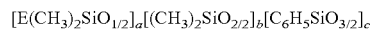
$[E(CH_3)_2SiO_{1/2}]_a[(CH_3)_2SiO_{2/2}]_b[C_6H_5SiO_{3/2}]_c$

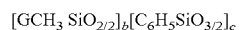
$[GCH_3 SiO_{2/2}]_b[C_6H_5SiO_{3/2}]_c$

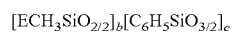
$[ECH_3SiO_{2/2}]_b[C_6H_5SiO_{3/2}]_c$

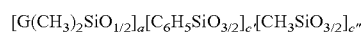
$[G(CH_3)_2SiO_{1/2}]_a[C_6H_5SiO_{3/2}]_{c'}[CH_3SiO_{3/2}]_{c"}$

$[E(CH_3)_2SiO_{1/2}]_a[C_6H_5SiO_{3/2}]_{c'}[CH_3SiO_{3/2}]_{c"}$

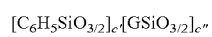
$[C_6H_5SiO_{3/2}]_{c'}[GSiO_{3/2}]_{c"}$

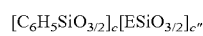
$[C_6H_5SiO_{3/2}]_{c'}[ESiO_{3/2}]_{c"}$

The method for preparing component (A) is not critical and can be exemplified by the following methods: the co-hydrolysis and condensation reaction of, for example, phenyltrialkoxysilane and alkoxysilane having an epoxy-functional monovalent organic group, e.g., 3-glycidoxypropyltrimethoxysilane or 2-(3,4-epoxycyclohexyl)ethyltrimethoxysilane; the alcohol-eliminating condensation reaction of the aforementioned alkoxysilane having an epoxy-functional monovalent organic group with a silanol-functional organopolysiloxane prepared by the hydrolysis and condensation of phenyltrichlorosilane or phenyltrialkoxysilane; a hydrosilylation reaction between olefin having an epoxy-functional monovalent organic group and SiH-functional organopolysiloxane prepared by co-hydrolysis and condensation of phenyltrichlorosilane or phenyltrialkoxysilane in the presence of an SiH-functional silane such as dimethylchlorosilane; an equilibration reaction in the presence of a base catalyst between (i) organopolysiloxane prepared by the hydrolysis and condensation of phenyltrichlorosilane or phenyltrialkoxysilane and (ii) trimethylsiloxy-endblocked methyl(3-glycidoxypropyl)siloxane-dimethylsiloxane copolymer or trimethylsiloxy-endblocked methyl{2-(3,4-epoxycyclohexyl)ethyl}siloxane-dimethylsiloxane copolymer; an equilibration reaction in the presence of a base catalyst between organopolysiloxane comprising the $C_6H_5SiO_{3/2}$ siloxane unit and cyclic methyl(3-glycidoxypropyl)siloxane or cyclic methyl{2-(3,4-epoxycyclohexyl)ethyl}siloxane; and an equilibration reaction in the presence of an acid or base catalyst among organopolysiloxane comprising the $C_6H_5SiO_{3/2}$ siloxane unit and cyclic methyl(3-glycidoxypropyl)siloxane or cyclic methyl{2-(3,4-epoxycyclohexyl)ethyl}siloxane and cyclic dimethylsiloxane.

The diorganosiloxane (B) is also a main component of the composition and is represented by the general formula:

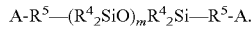

A-$R^5$—($R^4_2SiO)_m R^4_2Si$—$R^5$-A.

$R^4$ in the formula is substituted or unsubstituted monovalent hydrocarbon group that does not contain an aliphatically unsaturated bond and is specifically exemplified by alkyl group such as methyl, ethyl, propyl, butyl, pentyl, hexyl, and so forth; cycloalkyl group such as cyclopentyl, cyclohexyl, cycloheptyl, and so forth; aryl group such as phenyl, tolyl, xylyl, and so forth; aralkyl group such as benzyl, phenethyl, phenylpropyl, and so forth; and halogenated alkyl group such as 3-chloropropyl, 3,3,3-trifluoropropyl, and so forth. Alkyl group is preferred and methyl is particularly preferred. $R^5$ in the preceding formula is a divalent organic group and is specifically exemplified by alkylene group such as ethylene, methylethylene, propylene, butylene, pentylene, hexylene, and so forth; and alkylenoxyalkylene group such as ethylenoxyethylene, ethylenoxypropylene, ethylenoxybutylene, propylenoxypropylene, and so forth. Alkylene group is preferred and ethylene is particularly preferred. The subscript m in the formula given above is an integer with a value of at least 1 that represents the degree of polymerization of the diorganosiloxane main chain. The subscript m preferably is an integer with a value of at least 10 because this yields cured product from the composition that exhibits excellent flexibility. While the upper limit for m is not critical, m is preferably an integer no greater than 500.

In addition, A in the preceding formula is a siloxane residue with the average unit formula:

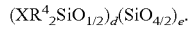

$(XR^4_2SiO_{1/2})_d(SiO_{4/2})_e$.

$R^4$ in this formula is substituted or unsubstituted monovalent hydrocarbon group that does not contain an aliphatically unsaturated bond and is exemplified by the same groups as provided above, wherein alkyl group is preferred and methyl is particularly preferred. X in this formula is a single bond, hydrogen atom, group defined as for the aforementioned $R^4$, epoxy-functional monovalent organic group, or alkoxysilylalkyl group. The group defined as for $R^4$ can be exemplified by the same groups as provided above, while the epoxy-functional monovalent organic group can be exemplified by glycidoxyalkyl groups such as 2-glycidoxyethyl, 3-glycidoxypropyl, 4-glycidoxybutyl, and so forth; 3,4-epoxycyclohexylalkyl groups such as 2-(3,4-epoxycyclohexyl)ethyl, 3-(3,4-epoxycyclohexyl)propyl, and so forth; and oxiranylalkyl groups such as 4-oxiranylbutyl, 8-oxiranyloctyl, and so forth. The alkoxysilylalkyl groups can be exemplified by trimethoxysilylethyl, trimethoxysilylpropyl, dimethoxymethylsilylpropyl, methoxydimethylsilylpropyl, triethoxysilylethyl, tripropoxysilylpropyl, and so forth. At least one X in each molecule is a single bond wherein bonding occurs through this single bond to $R^5$ in the aforementioned diorganopolysiloxane. In addition, at least two X's in each molecule must be epoxy-functional monovalent organic groups and are preferably glycidoxyalkyl and particularly preferably are 3-glycidoxypropyl. In addition, d in the preceding formula is a positive number; e is a positive number; and d/e is a positive number from 0.2 to 4.

The molecular weight of component (B) is not particularly limited, but the mass-average molecular weight of component (B) is preferably 500 to 1,000,000. The state of component (B) at 25° C. is also not restricted, but component (B) is preferably a liquid at 25° C. and its viscosity is preferably in the range of 50 to 1,000,000 mPa·s. This diorganosiloxane (B) can be prepared, for example, by the preparative method described in Japanese Laid Open (Unexamined) Patent Application Number Hei 6-56999 (56,999/1994).

The content of component (B) is not critical, but is preferably 0.1 to 800 parts by mass, more preferably 1 to 500 parts by mass, and particularly preferably 10 to 200 parts by mass, in each case per 100 parts by mass of component (A). When the content of component (B) is less than the lower limit on this range, the resulting cured product suffers from a reduction in flexibility and there is a propensity for cracking to occur. When the content of component (B) exceeds the upper limit on this range, the resulting composition will have a high viscosity and the handling characteristics will decline.

Component (C), which is a curing agent for epoxy resin, reacts with the epoxy groups in components (A) and (B) to bring about curing of the composition and is a compound that contains in each molecule preferably at least two functional groups capable of reacting with the epoxy group. This functional group can be specifically exemplified by the primary amino group, secondary amino group, hydroxyl group, phenolic hydroxyl group, carboxylic acid group, acid anhydride group, mercapto group, and silanol group. The phenolic hydroxyl group is preferred from the standpoint of reactivity and pot life. That is, component (C) is preferably a phenol compound and can be specifically exemplified by phenolic resins such as phenol-novolac resins, cresol-novolac resins, bisphenol A compounds, and so forth; and by phenolic hydroxyl-functional organosiloxanes wherein organosiloxane containing at least two phenolic hydroxyl groups in each molecule is preferred. The phenolic hydroxyl equivalent weight thereof is preferably not more than 1,000 and particularly preferably is not more than 500 for the high reactivity afforded by values of not more than 500.

The phenolic hydroxyl-functional organosiloxane encompassed by component (C) is preferably organosiloxane with the general formula:

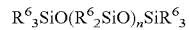

$R^6_3SiO(R^6_2SiO)_n SiR^6_3$ because this can improve the flexibility of the cured product from the composition. Each $R^6$ in this formula is independently selected from substituted or unsubstituted monovalent hydrocarbon groups and phenolic hydroxyl-functional monovalent organic groups. This monovalent hydrocarbon groups can be exemplified by the same groups as provided above, and preferably is alkyl groups or aryl groups and particularly preferably is methyl or phenyl. The phenolic hydroxyl-functional organic groups can be exemplified by the groups presented below. $R^7$ in the formulas is a divalent organic group and can be specifically exemplified by alkylene groups such as ethylene, methylethylene, propylene, butylene, pentylene, hexylene, and so forth; and by alkylenoxyalkylene groups such as ethylenoxyethylene, ethylenoxypropylene, ethylenoxybutylene, propyleneoxypropylene, amd so forth, wherein alkylene groups are preferred and propylene is particularly preferred.

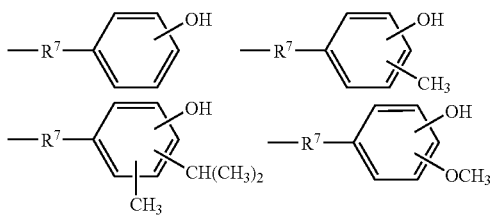

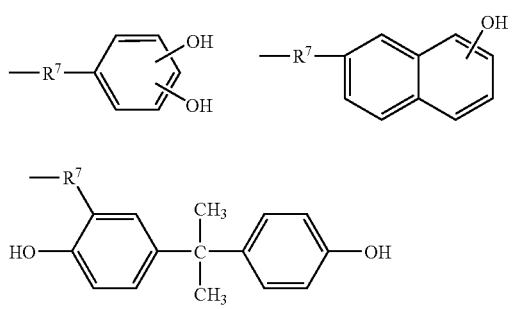

-continued n in the preceding formula is an integer from 0 to 1,000 and preferably is an integer from 0 to 100 and particularly preferably is an integer from 0 to 20. When n exceeds the upper limit on this range, the handling characteristics decline, the blendability into components (A) and (B) declines, and dilution of the resulting composition with, for example, organic solvent, may also be necessary.

The organosiloxane encompassed by component (C) can be exemplified by the organosiloxanes provided below. x in the formulas is an integer from 1 to 20 and y is an integer from 2 to 10.

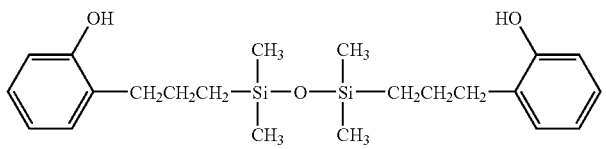

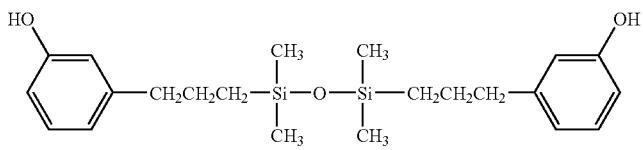

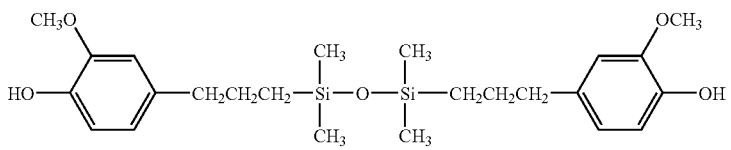

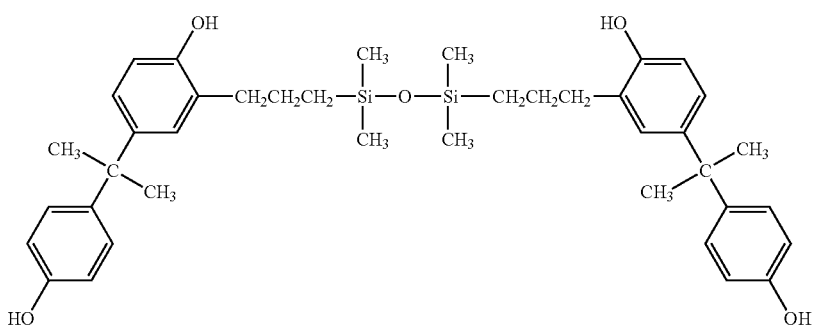

-continued

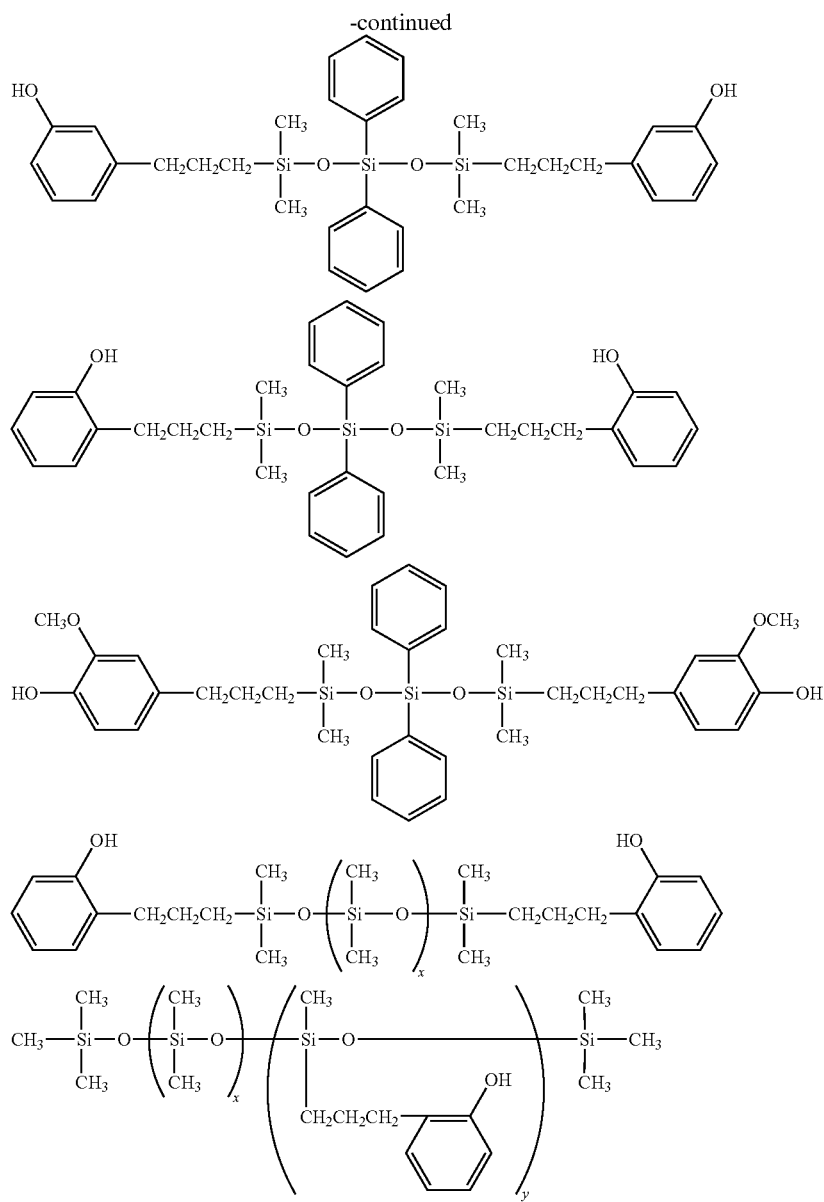

The method for preparing component (C) is not critical and can be exemplified by a hydrosilylation reaction between an alkenyl-functional phenol compound and SiH-functional organopolysiloxane.

The state of component (C) at 25° C. is not critical and component (C) can be a liquid or solid; however, it is preferably a liquid for the ease of handling this provides. When component (C) is a liquid at 25° C., its viscosity is preferably in the range of 1 to 1,000,000 mPa·s and particularly preferably is in the range of 10 to 5,000 mPa·s. The mechanical strength of the cured product declines when the viscosity at 25° C. falls below the lower limit on the aforementioned range, while the handling characteristics of the resulting composition decline when the upper limit on the aforementioned range is exceeded.

The content of component (C) is not specifically limited, but is preferably 0.1 to 500 parts by mass and particularly preferably is 0.1 to 200 parts by mass, in each case per 100 parts by mass of the total of components (A) and (B). When component (C) contains phenolic hydroxyl, component (C) is then used in an amount that provides a molar ratio of phenolic hydroxyl in component (C) to total epoxy in the instant composition of preferably 0.2 to 5, more preferably 0.3 to 2.5, and particularly preferably 0.8 to 1.5. It becomes increasingly difficult to obtain a thorough cure for the resulting composition when the molar ratio of phenolic hydroxyl in component (C) to total epoxy in the composition falls below the lower limit on the given range, while the mechanical properties of the cured product decline substantially at above the upper limit on the given range.

The composition under consideration may also contain a cure accelerator (D) as an optional component. This component (D) can be exemplified by tertiary amine compounds; organometal compounds, e.g., of aluminum or zirconium; organophosphorus compounds such as phosphine; and also by heterocyclic amine compounds, boron complex compounds, organoammonium salts, organosulfonium salts, organoperoxides, and reaction products from the preceding.

Examples here are phosphorus compounds such as triphenylphosphine, tributylphosphine, tri(p-methylphenyl)phosphine, tri(nonylphenyl)phosphine, triphenylphosphine/triphenylborate, tetraphenylphosphine/tetraphenylborate, and so forth; tertiary amine compounds such as triethylamine, benzyldimethylamine, α-methylbenzyldimethylamine, 1,8-diazabicyclo[5.4.0]undecene-7, and so forth; and imidazole compounds such as 2-methylimidazole, 2-phenylimidazole, 2-phenyl-4-methylimidazole, and so forth. The use of an encapsulated cure accelerator is preferred because this enables a lengthening of the composition's use time. A commercially available encapsulated cure accelerator is encapsulated amine-type cure accelerator comprising an amine-type cure accelerator incorporated in bisphenol A-type epoxy resin (for example, HX-3088 from Asahi Kasei Corporation). The content of component (D) is not specifically limited, but preferably is no more than 50 parts by mass, more preferably is 0.01 to 50 parts by mass, and particularly preferably is 0.1 to 5 parts by mass, in each case per 100 parts by mass of the total of components (A) and (B).

The composition may additionally contain a filler (E) in order to improve the mechanical strength of the cured product. Component (E) can be exemplified by fibrous fillers such as glass fibers, alumina fibers, alumina/silica ceramic fibers, boron fibers, zirconia fibers, silicon carbide fibers, metal fibers, and so forth; inorganic fillers such as fused silica, crystalline silica, precipitated silica, fumed silica, calcined silica, zinc oxide, calcined clay, carbon black, glass beads, alumina, talc, calcium carbonate, clay, aluminum hydroxide, magnesium hydroxide, barium sulfate, aluminum nitride, boron nitride, silicon carbide, magnesia, titania, beryllium oxide, kaolin, mica, zirconia, and so forth; very finely divided powders of metals such as gold, silver, copper, aluminum, nickel, palladium, and their alloys, and also very finely divided powders of brass, shape-memory alloys, and solder; very finely divided powders afforded by the vapor deposition or plating of a metal, e.g., gold, silver, nickel, or copper, on the surface of a very finely divided powder of, e.g., ceramic, glass, quartz, or organic resin; and mixtures of two or more of the preceding. Thermally conductive powders, e.g., of alumina, crystalline silica, aluminum nitride, boron nitride, and so forth, or reinforcing powders, e.g., of fused silica, precipitated silica, fumed silica, colloidal silica, and so forth, are preferred. Silver powder is preferred for imparting electrical conductivity and thermal conductivity to cured product from the composition. Alumina powder is preferred for imparting thermal conductivity to cured product from the composition. The filler shape can be exemplified by ground shapes, spheres, fibrous shapes, columns, flakes, scales, plates, and coils. The particle size is not critical, but the maximum particle size is generally no more than 200 μm and the average particle size is preferably in the range from 0.001 to 50 μm. The content of component (E) is not critical, but is preferably no greater than 5,000 parts by mass, more preferably is in the range of 10 to 4,000 parts by mass, and particularly preferably is in the range of 50 to 4,000 parts by mass, in each case per 100 parts by mass of the total of components (A) and (B). When filler other than the aforementioned very finely divided metal powder or thermally conductive filler is used as component (E), the content of component (E) is preferably no greater than 2,000 parts by mass, more preferably is in the range of 10 to 2,000 parts by mass, and particularly preferably is in the range of 50 to 1,000 parts by mass, in each case per 100 parts by mass of the total of components (A) and (B). A plate or scale shape is preferred because this can reduce the cure shrinkage rate in specific directions of the resulting cured product.

In order to lower the viscosity and improve the workability of the composition as well as lower the modulus of the cured product therefrom, the composition may also contain (F) organosiloxane having a functional group capable of reacting with the epoxy group or phenolic hydroxyl group (exclusive of the organosiloxanes corresponding to components (A), (B), and (C)). This functional group can be exemplified by the following epoxy-reactive groups: primary amino group, secondary amino group, hydroxyl group, phenolic hydroxyl group, carboxylic acid group, acid anhydride group, mercapto group, and silanol group, wherein the phenolic hydroxyl group is preferred from the standpoint of reactivity and pot life. In addition, when component (C) contains phenolic hydroxyl, this functional group is preferably the epoxy group. Component (F) preferably has a larger functional group equivalent weight than component (C) and a smaller molecular weight and/or viscosity than component (A) and/or component (B) and is specifically exemplified by polydimethylsiloxane having the glycidoxypropyl group at only one molecular chain terminal, polydimethylsiloxane having the hydroxyphenyl group at only one molecular chain terminal, and polydimethylsiloxane having the glycidoxypropyl group at both molecular chain terminals. While the content of component (F) is not specifically limited, it is preferably no more than 500 parts by mass and more preferably is in the range from 0.1 to 500 parts by mass, in each case per 100 parts by mass of the total of components (A) and (B).

A solvent (G) may also be incorporated in order to reduce the viscosity and improve the workability of the composition. There are no particular restrictions on this component (G) as long as it can dissolve components (A), (B), and (C), but volatile, low molecular weight substances are preferred. Component (G) can be exemplified by aliphatic hydrocarbons such as hexane, heptane, and so forth; aromatic hydrocarbons such as toluene, xylene, and so forth; and ketones such as acetone, methyl ethyl ketone, methyl isobutyl ketone, and so forth. The content of component (G) is not specifically limited, but is preferably no more than 100 parts by mass per 100 parts by mass of the total of components (A), (B), and (C) because this results in an improved workability for the composition.

An organic epoxy compound (H) may also be incorporated in the composition in order to improve the curability, workability, adhesiveness, and so forth of the composition as well as in order to adjust the modulus of the cured product. The state of this component (H) at 25° C. is not critical, and it can be a liquid or solid but is preferably a liquid. Component (H) is exemplified by bisphenol A-type epoxy resins, bisphenol F-type epoxy resins, and alicyclic epoxy resins. The content of component (H) is not critical, but is preferably no more than 500 parts by mass and particularly preferably is in the range of 0.1 to 500 parts by mass, in each case per 100 parts by mass of the total of components (A) and (B).

A coupling agent, for example, a silane coupling agent or titanate coupling agent, can also be incorporated in order to bring about good dispersion by component (E) in component (A) or (B) or their mixture and in order to improve the adhesiveness for substrate when the composition undergoes cure. The silane coupling agents can be exemplified by epoxy-functional alkoxysilanes such as 3-glycidoxypropyltrimethoxysilane, 3-glycidoxypropylmethyldiethoxysilane, 2-(3,4-epoxycyclohexyl)ethyltrimethoxysilane, and so forth; amino-functional alkoxysilanes such as N-(2-aminoethyl)-3-aminopropyltrimethoxysilane, 3-aminopropyltriethoxysilane, N-phenyl-3-aminopropyltrimethoxysilane, and so forth; and mercapto-functional alkoxysilanes such as 3-mercaptopropyltrimethoxysilane, and so forth. The titanate coupling agents can be exemplified by isopropoxytitanium tri(isostearate), and so forth. The content of coupling agent is not critical, but is preferably no more than 10 parts by mass and particularly preferably is 0.01 to 10 parts by mass, in each case per 100 parts by mass of the total of components (A) and (B).

Other optional components that may be incorporated in the composition include alkoxysilanes such as tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, and so forth.

The composition can be prepared by mixing components (A), (B), (C), and as necessary any optional components. The procedure for mixing these components is not critical and can be exemplified by methods in which components (A), (B), (C), and any optional components are simultaneously intermixed and by methods in which components (A) and (B) are premixed and component (C) and any optional components are thereafter incorporated. The device for mixing these components is not critical and can be exemplified by single- and twin-shaft continuous mixers, two-roll mills, Ross Mixers®, Hobart mixers, dental mixers, planetary mixers, and kneader mixers.

The composition can be used by methods such as transfer molding, injection molding, potting, casting, powder coating, immersion coating, dripping, and so forth. Liquids and pastes are preferred because this enables selection from a variety of use methods, such as potting, dispensing, screen printing, coating, and so forth, and because this also supports facile adaptation to low-volume applications. The composition, because it cures to give a highly flexible, highly adhesive cured product, is useful as, for example, a sealant, casting agent, coating, and adhesive for electrical components and electronic elements.

Electronic components of the present invention are described in detail in the following.

An electronic component of the present invention is characteristically sealed or bonded by cured product from a curable silicone composition as described hereinabove. Electronic components of the present invention can be exemplified by diodes, transistors, thyristors, monolithic ICs, hybrid ICs, LSIs, and VLSIs. Semiconductor elements encompassed by the present invention can be exemplified by diodes, transistors, thyristors, monolithic ICs, and also by the semiconductor elements in hybrid ICs.

An LSI that is an example of an electronic component of the present invention is shown in FIG. 1 (cross-sectional diagram). FIG. 1 shows an electronic component that has been sealed with cured product using the curable silicone composition of the present invention. In the electronic component in FIG. 1, a semiconductor element 1 is electrically connected, onto a substrate 2 that is provided with circuitry, by a ball grid 3, for example, of solder bumps, disposed on the semiconductor element 1. The material of the substrate 2 is exemplified by organic resins such as glass fiber-reinforced epoxy resin, bakelite resin, phenolic resins, and so forth; ceramics such as alumina and so forth; and metals such as copper, aluminum, and so forth. Other electronic components, such as resistors, capacitors, and coils, can also be mounted on the substrate 2 in addition to the semiconductor element 1. The gap between the semiconductor element 1 and the substrate 2 is filled in FIG. 1 with an underfill material 4, but the use of this underfill material is optional. The semiconductor element 1 and substrate 2 are then resin-sealed using the composition.

The method for fabricating an electronic component of the present invention is not critical, and the following method is provided as an example of the fabrication of the electronic component shown in FIG. 1. To begin with, the semiconductor element 1 is mounted on the substrate 2 and electrical connection is then established between the semiconductor element 1 and the substrate 2 using the ball grid 3. The underfill material 4 is then applied as necessary. The semiconductor element 1 and substrate 2 are thereafter resin-sealed using the composition. The method for carrying out resin-sealing using the composition can be exemplified by transfer molding, injection molding, potting, and casting.

EXAMPLES

The curable silicone composition and electronic components of the present invention will now be described in detail using Practical Examples and Comparative Examples. The properties of the curable silicone compositions and cured materials were measured by the following methods. The mass-average molecular weight reported in the examples is the mass-average molecular weight measured by gel permeation chromatography using toluene as solvent and calculated on a standard polystyrene basis.

[Viscosity]

The viscosity at 25° C. of the curable silicone composition was measured at 2.5 rpm using an E-type viscometer (Digital Viscometer DV-U-E, Model II, from Tokimec Inc.).

[Complex Viscoelastic Modulus]

The curable silicone composition was degassed at 70 mmHg and was then filled into a mold that had a cavity with dimensions of width 10 mm×length 50 mm×depth 2 mm. Press curing was carried out for 60 minutes at 150° C. under pressure of 2.5 MPa. Secondary heating in an oven for 2 hours at 180° C. then gave the cured product test specimen. The complex viscoelastic modulus at 25° C. was measured on this test specimen using an ARES Rheometer (RDA700 from Rheometric Scientific Inc.) at a 0.05% torsion and oscillation of 1 Hz.

[Adhesiveness]

About 1 cm$^3$ of the curable silicone composition was coated on each of the following adherends: glass panel (float plate glass from Kabushiki Kaisha Paltec), aluminum panel (A1050P from Kabushiki Kaisha Paltec), nickel panel (SPCC-SB from Kabushiki Kaisha Paltec), copper panel (C1100P from Kabushiki Kaisha Paltec), and gold-plated panel (C2801P from Nippon Testpanel Co., Ltd.). The adhesion evaluation test specimen was then fabricated by heating in an oven for 2 hours at 125° C. followed by heating in an oven for 2 hours at 180° C. The cured product was thereafter peeled from the test specimen using a dental spatula and the peeling mode was visually inspected under a microscope. The peeling mode was scored on the following scale:

CF=cohesive failure,
TCF=peeling at the interface with a thin layer remaining, and
AF=peeling at the interface.

[Warp]

A mold (10 mm×50 mm×1 mm (thickness)) was set on a polyimide resin film (Upilex125S from Ube Industries, Ltd., thickness=125 μm); the curable silicone composition was filled into the mold and was then covered with a Teflon™ sheet; and press molding was thereafter carried out for 10 minutes at 110° C. The cured product, which was adhered in a semi-cured state to the polyimide, was then removed from the mold and was post-cured for 2 hours in a convection oven at 180° C. After cooling to room temperature, the warp of the polyimide resin film was then measured as follows: the polyimide resin film was placed on a flat table; the shorter direction of the rectangle's distances was fixed on the table; and the distance from the table was measured with a vernier caliper at the two opposing ends. The average value of these two measurements is reported as the warp.

Practical Example 1

The following were mixed to give a curable silicone composition: 8.9 parts by mass of an organopolysiloxane (mass-average molecular weight=1,000, viscosity=1,290 mPa·s, epoxy equivalent weight=267) with the following average unit formula:

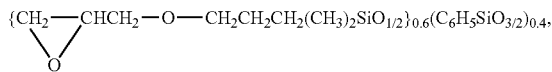

10.0 parts by mass of a dimethylpolysiloxane (mass-average molecular weight=78,000, viscosity=22,000 mPa·s, epoxy equivalent weight=450) with the following formula:

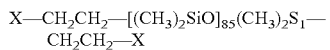

(wherein X is a siloxane residue represented by the average unit formula:

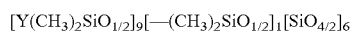

(wherein Y represents 3-glycidoxypropyl group.)), 19.0 parts by mass of an organotrisiloxane (viscosity=2,600 mPa·s, hydroxyl equivalent weight=330) with the following formula:

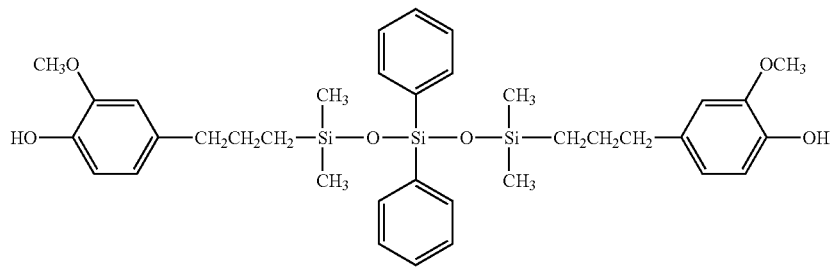

(this amount gave a molar ratio of phenolic hydroxyl in this component to the epoxy in this composition of 1.0), 0.1 parts by mass of carbon black (Denka Black from Denki Kagaku Kogyo Kabushiki Kaisha), 1.0 part by mass of an encapsulated amine-type cure accelerator comprising a mixture of bisphenol A-type epoxy resin and bisphenol F-type epoxy resin that contained 35 mass % of amine-type cure accelerator (HXA-4921HP from Asahi Kasei Corporation), 54.0 parts by mass of spherical amorphous silica (product of Denki Kagaku Kogyo Kabushiki Kaisha, average particle size=3.3 μm), 6.0 parts by mass of spherical amorphous silica (product of Denki Kagaku Kogyo Kabushiki Kaisha, average particle size=0.3 μm), and 1 part by mass of 3-glycidoxypropyltrimethoxysilane. This composition was vacuum defoamed and then subjected to measurement of its thermal expansion coefficient, complex viscoelastic modulus, adhesiveness, and warp by the methods described above. The results are reported in Table 1.

Practical Example 2

The following were mixed to give a curable silicone composition: 9.9 parts by mass of an organopolysiloxane (mass-average molecular weight=1,000, viscosity=1,290 mPa·s, epoxy equivalent weight=267) with the following average unit formula:

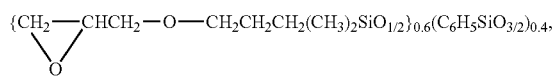

9.9 parts by mass of a dimethylpolysiloxane (mass-average molecular weight=47,900, viscosity=7,400 mPa·s, epoxy equivalent weight=580) with the following formula:

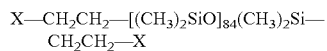

(wherein X is a siloxane residue represented by the average unit formula:

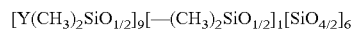

(wherein Y represents 3-glycidoxypropyl group and 3-trimethoxysilylpropyl group in a 6:4 ratio)), 18.0 parts by mass of an organotrisiloxane (viscosity=2,600 mPa·s, hydroxyl equivalent weight=330) with the following formula:

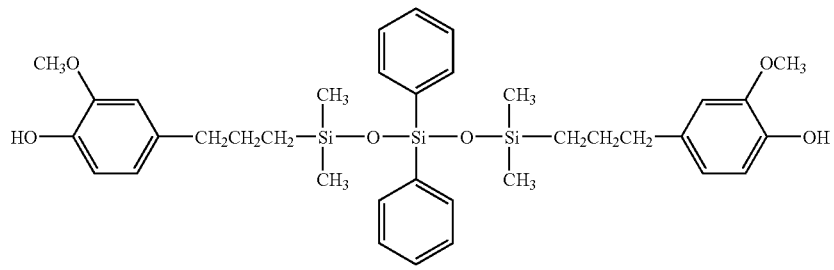

(this amount gave a molar ratio of phenolic hydroxyl in this component to the epoxy in this composition of 1.0), 0.1 parts by mass of carbon black (Denka Black from Denki Kagaku Kogyo Kabushiki Kaisha), 1.0 part by mass of an encapsulated amine-type cure accelerator comprising a mixture of bisphenol A-type epoxy resin and bisphenol F-type epoxy resin that contained 35 mass % of amine-type cure accelerator (HXA-4921HP from Asahi Kasei Corporation), 54.0 parts by mass of spherical amorphous silica (product of Denki Kagaku Kogyo Kabushiki Kaisha, average particle size=3.3 μm), 6.0 parts by mass of spherical amorphous silica (product of Denki Kagaku Kogyo Kabushiki Kaisha, average particle size=0.3 μm), and 1 part by mass of 3-glycidoxypropyltrimethoxysilane. This composition was vacuum defoamed and then subjected to measurement of its thermal expansion coefficient, complex viscoelastic modulus, adhesiveness, and warp by the methods described above. The results are reported in Table 1.

Practical Example 3

The following were mixed to give a curable silicone composition: 12.0 parts by mass of an organopolysiloxane (mass-average molecular weight=1,000, viscosity=1,290 mPa·s, epoxy equivalent weight=267) with the following average unit formula:

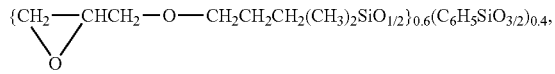

4.6 parts by mass of a dimethylpolysiloxane (mass-average molecular weight=78,000, viscosity=22,000 mPa·s, epoxy equivalent weight=450) with the following formula:

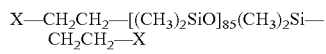

(wherein X is a siloxane residue represented by the average unit formula:

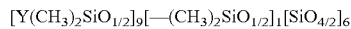

(wherein Y represents 3-glycidoxypropyl group.)), 17.0 parts by mass of an organotrisiloxane (viscosity=2,600 mPa·s, phenolic hydroxyl equivalent weight=330) with the following formula:

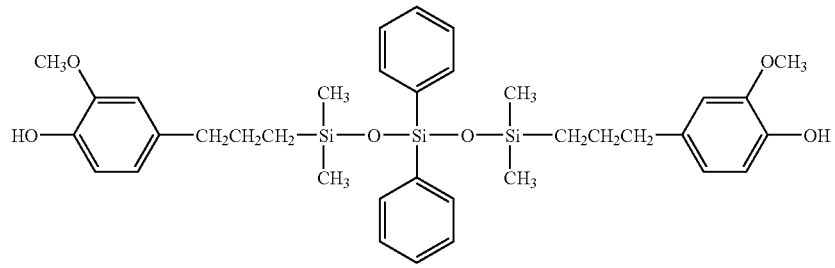

(this amount gave a molar ratio of phenolic hydroxyl in this component to the epoxy in this composition of 1.0), 1.0 part by mass of an encapsulated amine-type cure accelerator comprising a mixture of bisphenol A-type epoxy resin and bisphenol F-type epoxy resin that contained 35 mass % of amine-type cure accelerator (HXA-4921HP from Asahi Kasei Corporation), 48.6 parts by mass of spherical amorphous silica (product of Denki Kagaku Kogyo Kabushiki Kaisha, average particle size=3.3 μm), 5.4 parts by mass of spherical amorphous silica (product of Denki Kagaku Kogyo Kabushiki Kaisha, average particle size=0.3 μm), 1.4 parts by mass of colloidal silica (product of Fuso Chemical Co., Ltd., average primary particle size=15 nm), and 10.0 parts by mass of barium sulfate (B-30 from Sakai Chemical Industry Co., Ltd). This composition was vacuum defoamed and then subjected to measurement of its thermal expansion coefficient, complex viscoelastic modulus, adhesiveness, and warp by the methods described above. The results are reported in Table 1.

Comparative Example 1

The following were mixed to give a curable silicone composition: 17.0 parts by mass of an organopolysiloxane (mass-average molecular weight=1,000, viscosity=1,290 mPa·s, epoxy equivalent weight=267) with the following average unit formula:

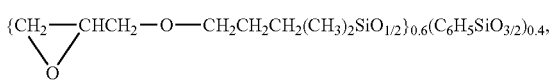

20.9 parts by mass of an organotrisiloxane (viscosity=2,600 mPa·s, phenolic hydroxyl equivalent weight=330) with the following formula:

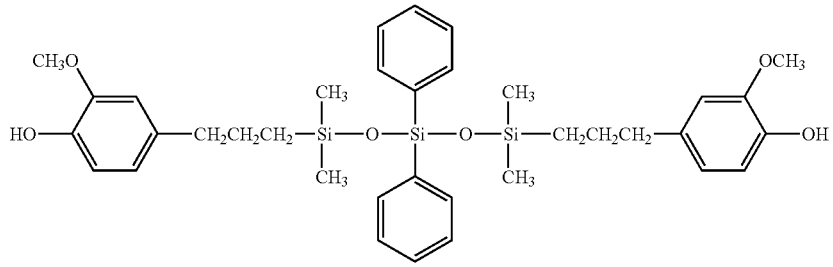

(this amount gave a molar ratio of phenolic hydroxyl in this component to the epoxy in this composition of 1.0), 0.1 parts by mass of carbon black (Denka Black from Denki Kagaku Kogyo Kabushiki Kaisha), 1.0 part by mass of an encapsulated amine-type cure accelerator comprising a mixture of bisphenol A-type epoxy resin and bisphenol F-type epoxy resin that contained 35 mass % of amine-type cure accelerator (HXA-4921HP from Asahi Kasei Corporation), 54.0 parts by mass of spherical amorphous silica (product of Denki Kagaku Kogyo Kabushiki Kaisha, average particle size=3.3 μm), 6.0 parts by mass of spherical amorphous silica (product of Denki Kagaku Kogyo Kabushiki Kaisha, average particle size=0.3 μm), and 1 part by mass of 3-glycidoxypropyltrimethoxysilane. This composition was vacuum defoamed and then subjected to measurement of its thermal expansion coefficient, complex viscoelastic modulus, adhesiveness, and warp by the methods described above. The results are reported in Table 1.

Comparative Example 2

The following were mixed to give a curable silicone composition: 9.9 parts by mass of an organopolysiloxane (mass-average molecular weight=1,000, viscosity=1,290 mPa·s, epoxy equivalent weight=267) with the following average unit formula:

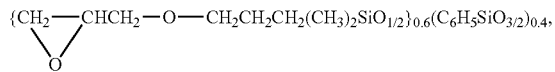

10.0 parts by mass of a dimethylpolysiloxane (number-average molecular weight=1,300, viscosity=20 mPa·s, epoxy equivalent weight=650) with the following formula:

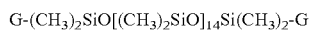

(wherein G is the 3-glycidoxypropyl group), 18.0 parts by mass of an organotrisiloxane (viscosity=2,600 mPa·s, phenolic hydroxyl equivalent weight=330) with the following formula:

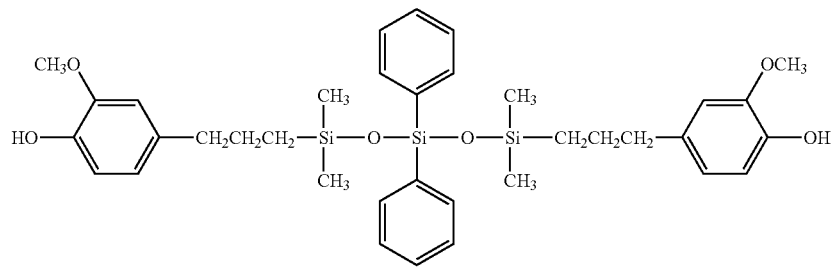

(this amount gave a molar ratio of phenolic hydroxyl in this component to the epoxy in this composition of 1.0), 0.1 parts by mass of carbon black (Denka Black from Denki Kagaku Kogyo Kabushiki Kaisha), 1.0 part by mass of a mixture of bisphenol A-type epoxy resin and bisphenol F-type epoxy resin with 35 mass % of an encapsulated amine catalyst (HXA-4921HP from Asahi Kasei Corporation), 54.0 parts by mass of spherical amorphous silica (product of Denki Kagaku Kogyo Kabushiki Kaisha, average particle size=3.3 μm), 6.0 parts by mass of spherical amorphous silica (product of Denki Kagaku Kogyo Kabushiki Kaisha, average particle size=0.3 μm), and 1 part by mass of 3-glycidoxypropyltrimethoxysilane. This composition was vacuum defoamed and then subjected to measurement of its thermal expansion coefficient, complex viscoelastic modulus, adhesiveness, and warp by the methods described above. The results are reported in Table 1.

TABLE 1

|  | Example No. | | | | |
|  | Practical Examples | | | Comparative Examples | |
| Properties | Pr. Ex. 1 | Pr. Ex. 2 | Pr. Ex. 3 | Comp. Ex. 1 | Comp. Ex. 2 |
|---|---|---|---|---|---|
| Viscosity (Pa · s) | 100 | 120 | 100 | 30 | 110 |
| Thermal expansion coefficient (ppm/° C.). | 110 | 110 | 115 | 110 | 110 |
| Complex viscoelastic modulus (MPa) | 50 | 50 | 40 | 100 | * |
| Adhesiveness | | | | | |
| Glass panel | CF | CF | CF | CF | * |
| Aluminum panel | CF | CF | CF | CF | * |
| Nickel panel | CF | CF | CF | CF | * |
| Copper panel | CF | CF | CF | CF | * |
| Gold-plated panel | CF | CF | CF | CF | * |
| Warp (mm) | 4 | 4 | 3 | 11 | * |

*The cured material was extremely brittle and could not be subjected to measurement.

Practical Examples 4 and 5 and Comparative Example 3

Semiconductor devices as shown in FIG. 1 were produced as described below using the curable silicone compositions prepared in Examples 1 and 2 and Comparative Example 1. 3 g of the curable silicone composition was coated on the underfilled semiconductor element (1 cm×1 cm×0.7 cm) and overmolding was carried out by pressing for 15 minutes with a mold held at 125° C. The cavity size was 5 cm×5 cm×0.1 cm. This was followed by a post-cure for 1 hour and 45 minutes in an oven at 125° C. and then a post-cure for 2 hours in an oven at 180° C. to bring about complete cure of the curable silicone composition. Inspection of the resulting semiconductor devices showed that the warp of the semiconductor device produced using the curable silicone composition prepared in Comparative Example 1 was larger than the warp of the semiconductor devices produced using the curable silicone compositions prepared in Examples 1 and 2.

Practical Examples 6 and 7 and Comparative Example 4

Semiconductor devices as shown in FIG. 1 were produced as described below using the curable silicone compositions prepared in Examples 1 and 2 and Comparative Example 1.

The curable silicone composition was filled by screen printing on the underfilled semiconductor element (1 cm×1 cm×0.7 cm). The cavity size was 5 cm×5 cm×0.1 cm. The semiconductor device was then removed from the screen printer stage and the curable silicone composition was cured by heating in an oven for 2 hours at 125° C. and 2 hours at 180° C. Inspection of the resulting semiconductor devices showed that the warp of the semiconductor device produced using the curable silicone composition prepared in Comparative Example 1 was larger than the warp of the semiconductor devices produced using the curable silicone compositions prepared in Examples 1 and 2.

INDUSTRIAL APPLICABILITY

The curable silicone composition of the present invention can be used by methods such as transfer molding, injection molding, potting, casting, powder coating, immersion coating, dripping, and so forth, and, because it cures to give a highly flexible, highly adhesive cured product, is useful as, for example, a sealant, casting agent, coating, and adhesive for electrical components and electronic elements.

The invention claimed is:

1. A curable silicone composition comprising:
   (A) an organopolysiloxane that is represented by the average unit formula:

$(R^1{}_3SiO_{1/2})_a(R^2{}_2SiO_{2/2})_b(R^3SiO_{3/2})_c$ wherein $R^1$, $R^2$, and $R^3$ are each independently selected from substituted or unsubstituted monovalent hydrocarbon groups and epoxy-functional monovalent organic groups, with the proviso that at least 20 mole % of $R^3$ are aryl groups, and a, b, and c are numbers that satisfy $0 \leq a \leq 0.8$, $0 \leq b \leq 0.8$, $0.2 \leq c \leq 0.9$, and $a+b+c=1$,
   and that has at least two of the aforementioned epoxy-functional monovalent organic groups in each molecule;
   (B) a diorganosiloxane represented by the general formula:

$A-R^5-(R^4{}_2SiO)_mR^4{}_2Si-R^5-A$ wherein $R^4$ is substituted or unsubstituted monovalent hydrocarbon group that does not contain an aliphatically unsaturated bond, $R^5$ is a divalent organic group, A is a siloxane residue with the average unit formula:

$(XR^4{}_2SiO_{1/2})_d(SiO_{4/2})_e$ wherein $R^4$ is defined as above; X is a single bond, hydrogen atom, group defined as for the aforementioned $R^4$, epoxy-functional monovalent organic group, or alkoxysilylalkyl group, with the proviso that at least one X in each molecule is a single bond and at least two X's in each molecule are epoxy-functional monovalent organic groups; d is a positive number; e is a positive number; and d/e is a positive number from 0.2 to 4,
   and m is an integer with a value of at least 1; and
   (C) a curing agent for epoxy resin, wherein component (C) is an organosiloxane with the general formula:

$R^6{}_3SiO(R^6{}_2SiO)_nSiR^6{}_3$, wherein $R^6$ is a substituted or unsubstituted monovalent hydrocarbon group or phenolic hydroxyl-functional monovalent organic group, with the provisos that at least two $R^6$ groups in each molecule are each a phenolic hydroxyl-functional monovalent organic group and that at least one $R^6$ group that is present at each terminal of the molecule is a phenolic hydroxyl-functional monovalent organic group, and n is an integer from 0 to 1,000.

2. The curable silicone composition according to claim 1, wherein the epoxy-functional monovalent organic group in component (A) is a glycidoxyalkyl group, epoxycycloalkylalkyl group, or oxiranylalkyl group.

3. The curable silicone composition according to claim 1, wherein m in component (B) is an integer with a value of at least 10.

4. The curable silicone composition according to claim 1, wherein the content of component (B) is 0.1 to 800 parts by mass per 100 parts by mass of component (A).

5. The curable silicone composition according to claim 1, wherein the content of component (C) is 0.1 to 500 parts by mass per 100 parts by mass of the total of components (A) and (B).

6. The curable silicone composition according to claim 1, that additionally comprises a cure accelerator (D).

7. The curable silicone composition according to claim 6, wherein component (D) is an encapsulated amine-type cure accelerator.

8. The curable silicone composition according to claim 6, wherein the content of component (D) is 0.01 to 50 parts by mass per 100 parts by mass of the total of components (A) and (B).

9. The curable silicone composition according to claim 1, that additionally comprises a filler (E).

10. An electronic component that is sealed or bonded by a cured product from a curable silicone composition according to claim 1.

* * * * *

UNITED STATES PATENT AND TRADEMARK OFFICE
CERTIFICATE OF CORRECTION

| | | |
|---|---|---|
| PATENT NO. | : 8,338,527 B2 | Page 1 of 1 |
| APPLICATION NO. | : 11/912643 | |
| DATED | : December 25, 2012 | |
| INVENTOR(S) | : Yoshitsugu Morita et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 562 days.

Signed and Sealed this
Fifteenth Day of July, 2014

Michelle K. Lee
*Deputy Director of the United States Patent and Trademark Office*